United States Patent
Kim et al.

(10) Patent No.: US 12,193,343 B2
(45) Date of Patent: Jan. 7, 2025

(54) VERTICAL VARIABLE RESISTANCE MEMORY DEVICES

(71) Applicant: SAMSUNG ELECTRONICS CO., LTD., Suwon-si (KR)

(72) Inventors: Hyuncheol Kim, Seoul (KR);
Yongseok Kim, Suwon-si (KR);
Hyeoungwon Seo, Yongin-si (KR);
Sungwon Yoo, Hwaseong-si (KR);
Kyunghwan Lee, Seoul (KR); Jaeho Hong, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 361 days.

(21) Appl. No.: 17/192,093

(22) Filed: Mar. 4, 2021

(65) Prior Publication Data

US 2022/0029095 A1 Jan. 27, 2022

(30) Foreign Application Priority Data

Jul. 23, 2020 (KR) .................. 10-2020-0091631

(51) Int. Cl.
*H10N 70/00* (2023.01)
*H01L 29/423* (2006.01)
*H10B 63/00* (2023.01)

(52) U.S. Cl.
CPC ....... *H10N 70/8265* (2023.02); *H10B 63/845* (2023.02); *H10N 70/841* (2023.02);
(Continued)

(58) Field of Classification Search
CPC ............ H10N 70/8265; H10N 70/841; H10N 70/8836; H10N 70/884; H10B 63/845; H01L 29/4234
See application file for complete search history.

(56) References Cited

U.S. PATENT DOCUMENTS 8,633,104 B2    1/2014   Pyo et al.
8,822,971 B2    9/2014   Park et al.
(Continued)

FOREIGN PATENT DOCUMENTS

KR   10-2011-0073648    6/2011
KR   10-2012-0113338   10/2012
KR   10-2020-0044378    4/2020

OTHER PUBLICATIONS

Office Action in Korean Appln. No. KR10-2020-0091631, mailed on Aug. 29, 2024, 21 pages (with English translation).

*Primary Examiner* — Herve-Louis Y Assouman
*Assistant Examiner* — Christopher M Roland
(74) *Attorney, Agent, or Firm* — Fish & Richardson P.C.

(57) ABSTRACT

A vertical variable resistance memory device including gate electrodes spaced apart from each other in a first direction on a substrate, each of the gate electrodes including graphene and extending in a second direction, the first direction being substantially perpendicular to an upper surface of the substrate and the second direction being substantially parallel to the upper surface of the substrate; first insulation patterns between the gate electrodes, each of the first insulation patterns including boron nitride (BN); and at least one pillar structure extending in the first direction through the gate electrodes and the first insulation patterns on the substrate, wherein the at least one pillar structure includes a vertical gate electrode extending in the first direction; and a variable resistance pattern on a sidewall of the vertical gate electrode.

16 Claims, 14 Drawing Sheets

(52) U.S. Cl.
CPC ....... *H10N 70/8836* (2023.02); *H10N 70/884* (2023.02); *H01L 29/4234* (2013.01)

(56) References Cited

U.S. PATENT DOCUMENTS

| | | | |
|---|---|---|---|
| 9,076,723 | B1 | 7/2015 | Matsunami et al. |
| 9,093,370 | B2 | 7/2015 | Hwang |
| 9,214,225 | B2 | 12/2015 | Park |
| 9,553,101 | B2 | 1/2017 | Kim et al. |
| 9,698,043 | B1* | 7/2017 | Chan .................. H01L 21/3065 |
| 9,748,263 | B2 | 8/2017 | Jang et al. |
| 10,199,391 | B2 | 2/2019 | Ishikura et al. |
| 2012/0256253 | A1 | 10/2012 | Hwang et al. |
| 2012/0281484 | A1* | 11/2012 | Cho ...................... H01L 29/792 977/734 |
| 2013/0119349 | A1* | 5/2013 | Chung .................. H01L 29/778 977/734 |
| 2015/0372005 | A1* | 12/2015 | Yon ........................ H10B 41/27 257/314 |
| 2017/0117222 | A1* | 4/2017 | Kim .................... H01L 23/5283 |
| 2018/0144930 | A1* | 5/2018 | Glavin .................. B82B 3/0038 |
| 2018/0358470 | A1 | 12/2018 | Lee et al. |
| 2019/0044063 | A1 | 2/2019 | Fratin et al. |
| 2019/0221575 | A1* | 7/2019 | Dong .................. H01L 21/0262 |
| 2019/0393241 | A1* | 12/2019 | Baek ...................... H10B 43/50 |
| 2020/0185408 | A1* | 6/2020 | Song ...................... H10B 41/27 |
| 2020/0194669 | A1* | 6/2020 | Jang ...................... H10N 70/841 |
| 2021/0123161 | A1* | 4/2021 | Lee .................... H01L 21/02274 |
| 2021/0151460 | A1* | 5/2021 | Kim ...................... H10B 43/40 |
| 2022/0328515 | A1* | 10/2022 | Kim ...................... H10B 41/27 |
| 2023/0049653 | A1* | 2/2023 | Lee ...................... H10B 41/27 |

\* cited by examiner

VERTICAL VARIABLE RESISTANCE MEMORY DEVICES

CROSS-REFERENCE TO RELATED APPLICATION

Korean Patent Application No. 10-2020-0091631, filed on Jul. 23, 2020, in the Korean Intellectual Property Office, and entitled: "Vertical Variable Resistance Memory Devices," is incorporated by reference herein in its entirety.

BACKGROUND

1. Field

Embodiments relate to a vertical variable resistance memory device.

2. Description of the Related Art

In a variable resistance memory device, the mobility of electrons in gate electrodes may be considered.

SUMMARY

The embodiments may be realized by providing a vertical variable resistance memory device including gate electrodes spaced apart from each other in a first direction on a substrate, each of the gate electrodes including graphene and extending in a second direction, the first direction being substantially perpendicular to an upper surface of the substrate and the second direction being substantially parallel to the upper surface of the substrate; first insulation patterns between the gate electrodes, each of the first insulation patterns including boron nitride (BN); and at least one pillar structure extending in the first direction through the gate electrodes and the first insulation patterns on the substrate, wherein the at least one pillar structure includes a vertical gate electrode extending in the first direction; and a variable resistance pattern on a sidewall of the vertical gate electrode.

The embodiments may be realized by providing a vertical variable resistance memory device including gate electrode structures each including gate electrodes spaced apart from each other in a first direction on a substrate, each of the gate electrodes extending in a second direction, the gate electrode structures being spaced apart from each other in a third direction, the first direction being substantially perpendicular to an upper surface of the substrate, the second direction being substantially parallel to the upper surface of the substrate, the third direction being substantially parallel to the upper surface of the substrate and crossing the second direction, and the gate electrodes in each of the gate electrode structures being stacked in a staircase shape in which extension lengths of the gate electrodes in the second direction decrease in a stepwise manner from a lowermost level toward an uppermost level; first insulation patterns between the gate electrodes in each of the gate electrode structures, each of the first insulation patterns including hexagonal boron nitride (h-BN) or amorphous boron nitride (a-BN); second insulation patterns between the gate electrode structures, each of the second insulation patterns including h-BN or a-BN and electrically insulating the gate electrode structures from each other; and at least one pillar structure extending in the first direction on the substrate, the at least one pillar structure extending through the gate electrodes and the first insulation patterns therebetween in each of the gate electrode structures, wherein the at least one pillar structure includes a vertical gate electrode extending in the first direction; and a variable resistance pattern on a sidewall of the vertical gate electrode, and wherein the second insulation pattern has an extension length in the second direction greater than or equal to an extension length of a lowermost one of the gate electrodes in each of the gate electrode structures.

The embodiments may be realized by providing a vertical variable resistance memory device including gate electrode structures each including gate electrodes spaced apart from each other in a first direction on a substrate, each of the gate electrodes including graphene and extending in a second direction, the gate electrode structures being spaced apart from each other in a third direction, the first direction being substantially perpendicular to an upper surface of the substrate, the second direction being substantially parallel to the upper surface of the substrate, and the third direction being substantially parallel to the upper surface of the substrate and crossing the second direction; first insulation patterns between the gate electrodes in each of the gate electrode structures, each of the first insulation patterns including hexagonal boron nitride (h-BN) or amorphous boron nitride (a-BN); second insulation patterns between the gate electrode structures, each of the second insulation patterns including h-BN or a-BN and electrically insulating the gate electrode structures from each other; pillar structures each extending in the first direction on the substrate, each of the pillar structures extending through the gate electrodes and the first insulation patterns therebetween in each of the gate electrode structures, and each of the pillar structures including a vertical gate electrode including graphene and extending in the first direction; and a variable resistance pattern on a sidewall of the vertical gate electrode, first wirings each extending on the pillar structures in the third direction and electrically connected to the vertical electrodes of the pillar structures; and second wirings each extending in the second direction on the gate electrode structures and electrically connected to the gate electrode structures.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter in the specifications (and not in the claims necessarily), a direction substantially perpendicular to an upper surface of a substrate may be defined as a first direction D1, and two directions substantially parallel to the upper surface of the substrate and crossing each other may be defined as second and third directions D2 and D3, respectively. In example embodiments, the second and third directions D2 and D3 may be substantially perpendicular to each other.

It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section, and do not imply or require sequential inclusion.

Figure 1:
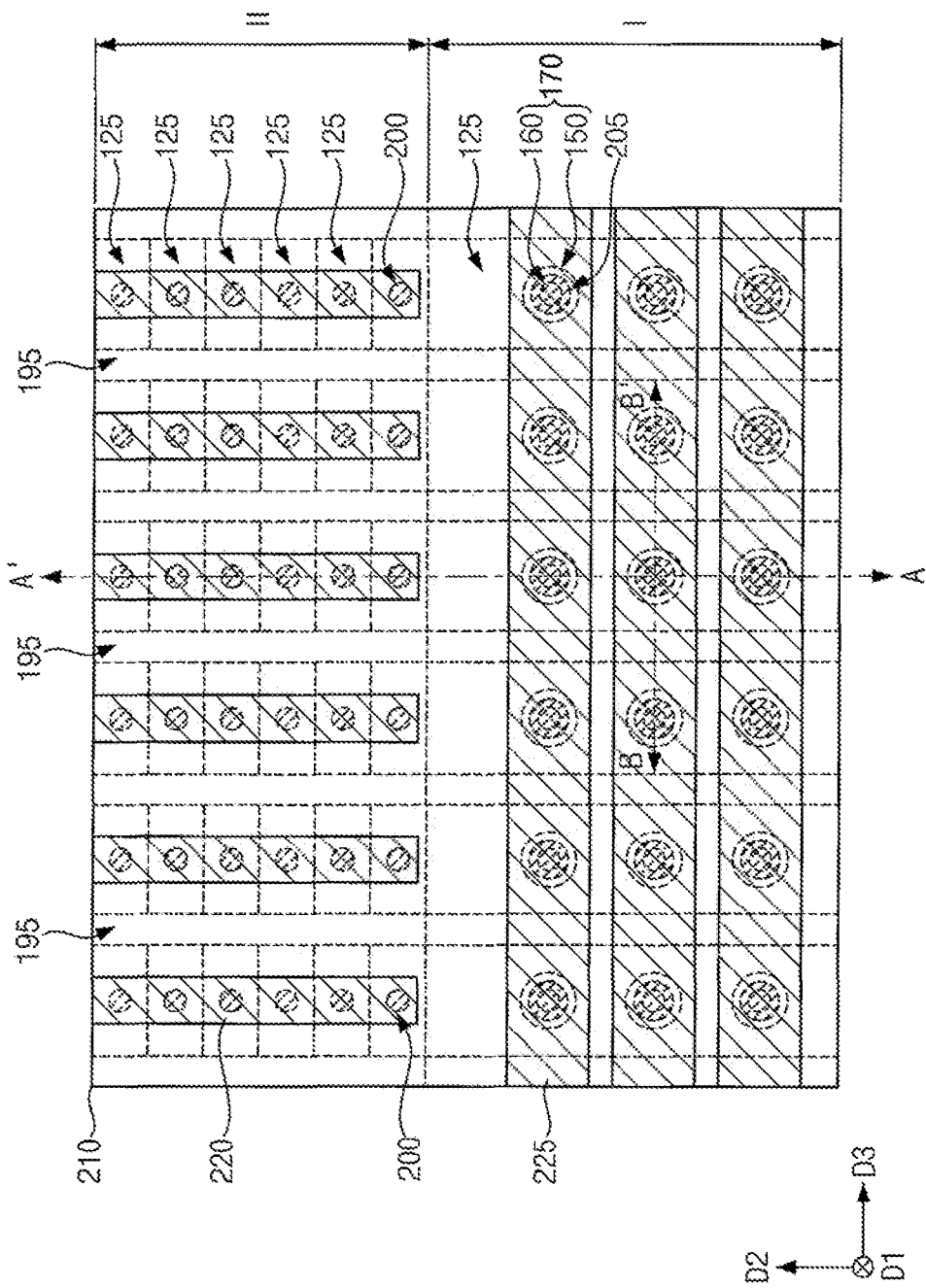
FIGS. 1 to 3 are a plan view and cross-sectional views of a vertical variable resistance memory device in accordance with example embodiments.
Figure 2:
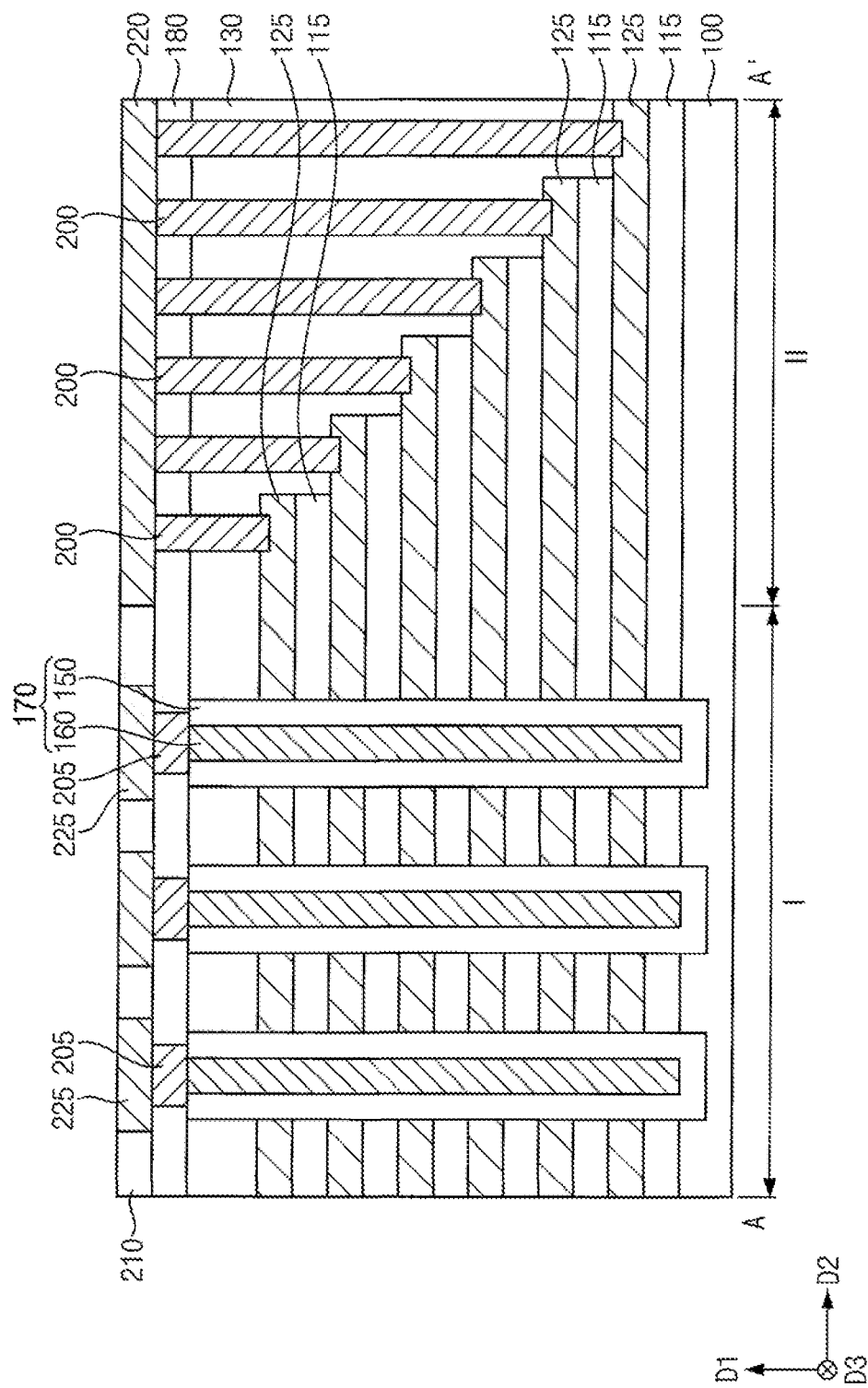
Figure 3:
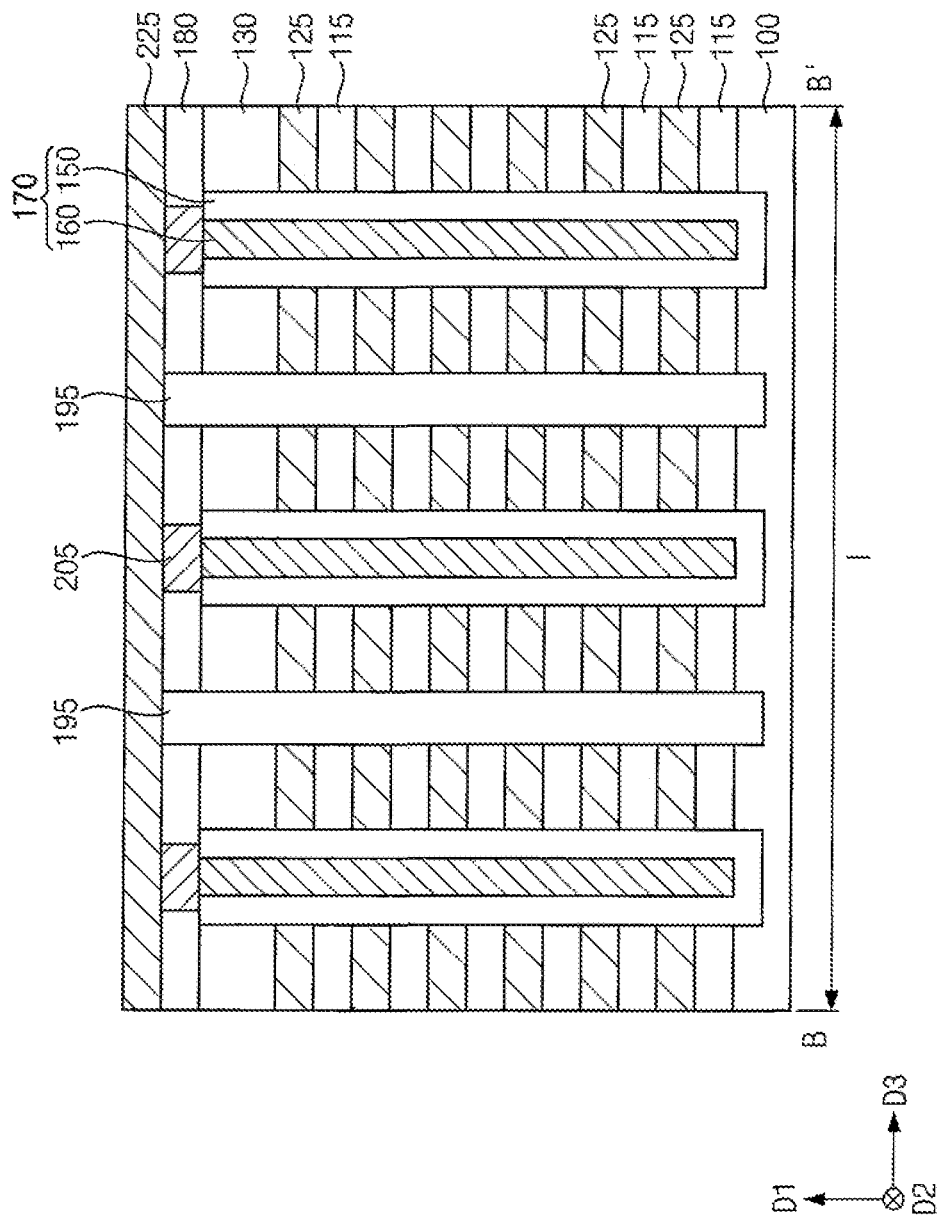
Figure 4:
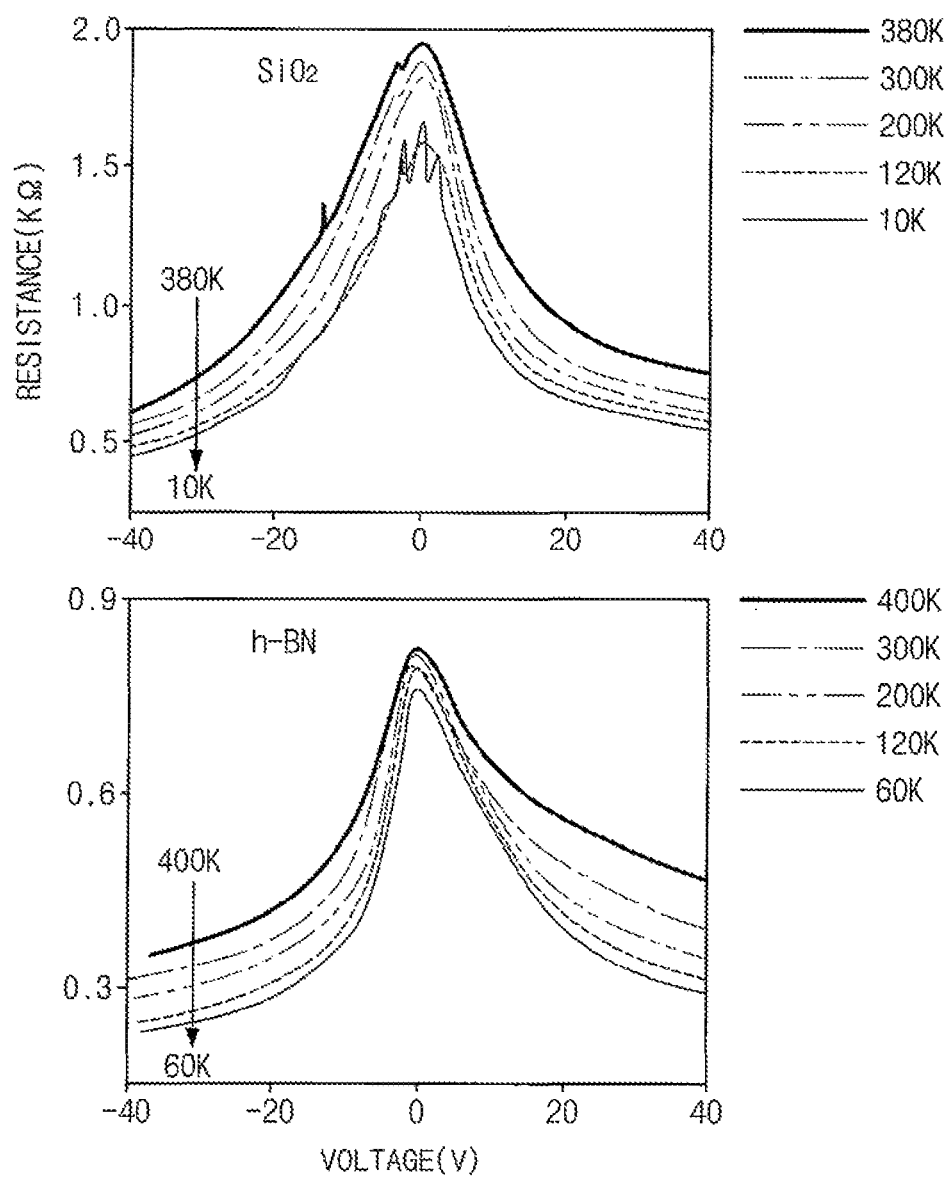
FIG. 4 illustrates graphs of a resistance of a gate electrode in accordance with a Comparative Example and a resistance of a gate electrode in accordance with an Example.

FIGS. 1 to 3 are a plan view and cross-sectional views of a vertical variable resistance memory device in accordance with example embodiments. FIG. 4 illustrates graphs of a resistance of a gate electrode in accordance with a Comparative Example and a resistance of a gate electrode in accordance with an Example. FIG. 1 is the plan view, FIG. 2 is a cross-sectional view taken along a line A-A' of FIG. 1, and FIG. 3 is a cross-sectional view taken along a line B-B' of FIG. 1.

Referring to FIGS. 1 to 3, the vertical variable resistance memory device may include a gate electrode 125, first and second insulation patterns 115 and 195, and a pillar structure 170 on a substrate 100. In an implementation, the vertical variable resistance memory device may include first and second contact plugs 200 and 205, first and second wirings 220 and 225, and first to third insulating interlayers 130, 180 and 210.

The substrate 100 may include silicon, germanium, silicon-germanium or a III-V compound such as GaP, GaAs, GaSb, or the like. In an implementation, the substrate 100 may be a silicon-on-insulator (SOI) substrate or a germanium-on-insulator (GOI) substrate. As used herein, the term "or" is not an exclusive term, e.g., "A or B" would include A, B, or A and B.

In an implementation, the substrate 100 may include a first region I and a second region II at least partially surrounding the first region I. The first region I may be a cell region on which memory cells may be formed, and the second region II may be an extension region or a pad region on which contact plugs for transferring electrical signals to the memory cells may be formed.

In an implementation, a plurality of gate electrodes 125 may be spaced apart from each other in the first direction D1 on the first and second regions I and II of the substrate 100 to form a gate electrode structure, and each of the gate electrodes 125 may extend (e.g., lengthwise) in the second direction D2. The gate electrodes 125 may be stacked in a staircase shape in which extension lengths of the gate electrodes 125 decrease from a lowermost level toward an uppermost level (e.g., a length of a gate electrode 125 proximate to the substrate 100 may be greater than a length of a gate electrode distal to the substrate 100).

Hereinafter, a portion of each of the gate electrodes 125 not overlapped with an upper gate electrode 125, e.g., each of opposite end portions in the second direction D2 of each of the gate electrodes 125, may be referred to as a pad.

In an implementation, a plurality of gate electrode structures may be spaced apart from each other in the third direction.

In an implementation, each of the gate electrodes 125 in each of the gate electrode structures may serve as one of a ground selection line (GSL), a word line, and a string selection line (SSL). In an implementation, a lowermost one of the gate electrodes 125 may serve as the GSL, an uppermost one and a second one from above of the gate electrodes 125 may serve as the SSL, and other ones of the gate electrodes 125 may serve as the word line.

In an implementation, each of the gate electrodes 125 may include graphene.

The first insulation patterns 115 may be between the gate electrodes 125 (spaced apart from each other in the first direction D1) in each gate electrode structure, and may contact (e.g., directly contact) the gate electrodes 125. Each of the first insulation patterns 115 and one of the gate electrodes 125 directly thereon may form a "step layer," and extension lengths in the second direction D2 of the first insulation patterns 115, which may correspond to the extension lengths of the gate electrodes 125, respectively, may decrease in a stepwise manner from a lowermost level toward an uppermost level.

In an implementation, the first insulation pattern 115 and the gate electrode 125 stacked in the first direction D1 may form a "step layer," a plurality of step layers may be stacked in the first direction D1 to form a mold having a staircase shape, and a plurality of molds may be spaced apart from each other in the third direction D3 on the substrate 100. A portion of each step layer in each mold not overlapped with upper step layers, e.g., each opposite end portions in the second direction D2 of each step layer may be referred to as a "step." In an implementation, the steps of each mold may be on the second region II of the substrate 100.

In an implementation, the second insulation patterns 195 may be between the molds, and may contact (e.g., directly contact) opposite sidewalls in the third direction D3 of the molds. In an implementation, the second insulation pattern 195 may contact opposite sidewalls in the third direction D3 of the gate electrodes 125 and the first insulation patterns 115 in each mold.

In an implementation, the second insulation pattern 195 may extend (e.g., lengthwise) in the second direction D2 on the first and second regions I and II of the substrate 100, and may separate the molds disposed in the third direction D3 from each other. Thus, an extension length in the second direction D2 of the second insulation pattern 195 may be greater than or equal to an extension length in the second direction D2 of a step layer having a maximum length among the step layers in each mold.

In an implementation, the extension length in the second direction D2 of the second insulation pattern 195 may be greater than or equal to an extension length in the second direction D2 of a lowermost one of the gate electrodes 125. In an implementation, the second insulation pattern 195 may be between the molds, and may protrude from the molds in the second direction D2 at an upper level where an extension length in the second direction D2 of the step layer is relatively small.

In an implementation, an upper surface (e.g., surface facing away from the substrate 100 in the first direction D1) of the second insulation pattern 195 may be higher than upper surfaces of the molds, e.g., upper surfaces of the gate electrode structures included in the molds.

In an implementation, a lower surface and sidewalls in the third direction D3 of the gate electrodes 125 (except for an uppermost one thereof included in each mold) may be covered by the first and second insulation patterns 115 and 195.

In an implementation, each of the first and second insulation patterns 115 and 195 may include boron nitride BN. In an implementation, each of the first and second insulation patterns 115 and 195 may include hexagonal boron nitride (h-BN), which is a two-dimensional material. In an implementation, each of the first and second insulation patterns 115 and 195 may include amorphous boron nitride (a-BN).

The first and second insulation patterns 115 and 195 may include substantially the same material, and may be merged with each other.

The pillar structure 170 may extend (e.g., lengthwise) in the first direction D1 on the first region I of the substrate 100 through the mold, e.g., the gate electrodes 125 and the first insulation patterns 115. In an implementation, a plurality of pillar structures 170 may be spaced apart from each other in each of the second and third directions D2 and D3. In an implementation, the pillar structures 170 extending through each mold may be spaced apart in the second direction D2, the molds may be formed in the third direction D3, and the pillar structures 170 may be also spaced apart in the third direction D3 correspondingly. In an implementation, the pillar structure 170 may have a circular shape in a plan view.

The pillar structure 170 may include a vertical electrode 160 extending in the first direction D1 and a variable resistance pattern 150 covering a sidewall and a lower surface of the vertical electrode 160.

In an implementation, the vertical electrode 160 may include graphene.

In an implementation, the variable resistance pattern 150 may include a material in which an electrical path, e.g., a filament may be generated by a difference between voltages applied to respective opposite ends of the variable resistance pattern 150. In an implementation, the filament may be generated by oxygen vacancy due to the movement of oxygen included in the variable resistance pattern 150. In an implementation, the variable resistance pattern 150 may include a perovskite material or a transition metal oxide (TMO).

The perovskite material may include, e.g., STO ($SrTiO_3$), BTO ($BaTiO_3$), PCMO ($Pr_{1-x}Ca_xMnO_3$), or the like. The TMO may include, e.g., titanium oxide ($TiO_x$), zirconium oxide ($ZrO_x$), aluminum oxide ($AlO_x$), hafnium oxide ($HfO_x$), tantalum oxide ($TaO_x$), niobium oxide ($NbO_x$), cobalt oxide ($CoO_x$), tungsten oxide (WOO, lanthanum oxide ($LaO_x$), zinc oxide ($ZnO_x$), or the like. These may be used alone or in a combination thereof.

In an implementation, the variable resistance pattern 150 may include a single layer or a composite layer having a plurality of single layers sequentially stacked.

The first contact plug 200 may extend in the first direction D1 on the second region II of the substrate 100 to contact a pad of each of the gate electrodes 125, and the second contact plug 205 may extend in the first direction D1 on the first region I of the substrate 100 to contact an upper surface of each of the vertical electrodes 160.

The first wiring 220 may extend in the second direction D2 on the second region II of the substrate 100 to contact upper surfaces of the first contact plugs 200, and the second wiring 225 may extend in the third direction D3 on the first region I of the substrate 100 to contact upper surfaces of the second contact plugs 205.

In an implementation, a plurality of first wirings 220 corresponding to the gate electrode structures may be spaced apart in the third direction D3, and a plurality of second wirings 225 corresponding to the vertical electrodes 160 may be spaced apart in the second direction D2. The first wiring 220 may apply electrical signals to the gate electrodes 125 serving as the word line, the GSL and the SSL, respectively, and the second wiring 225 may serve as a bit line.

The first and second contact plugs 200 and 205 and the first and second wirings 220 and 225 may include, e.g., a metal, a metal nitride, a metal silicide, doped polysilicon, or the like.

The first to third insulating interlayers 130, 180 and 210 may be sequentially stacked in the first direction D1 on the substrate 100. The first insulating interlayer 130 may cover sidewalls and upper surfaces of the molds. The first contact plug 200 may extend through the first and second insulating interlayers 130 and 180, and the second contact plug 205 may extend through the second insulating interlayer 180. The first and second wirings 220 and 225 may extend through the third insulating interlayer 210. The first to third insulating interlayers 130, 180 and 210 may include an oxide, e.g., silicon oxide.

In the vertical variable resistance memory device, each of the gate electrode 125 and the vertical electrode 160 may include graphene instead of a metal, and thus may have thicknesses and widths that may be much smaller than those of other gate electrodes and vertical electrodes.

The gate electrode 125 may have a small thickness, e.g., in a range of about 0.3 nm to about 10 nm, an upper surface of the gate electrode structure including the gate electrodes 125 may be lowered, and forming a hole 140 for forming the pillar structure 170 extending through the gate electrode structure may be facilitated.

The first insulation pattern 115 between the gate electrodes 125 including graphene may include, e.g., boron nitride such as h-BN instead of silicon oxide, and a surface roughness between the gate electrodes 125 and the first insulation pattern 115 may decrease, which may cause enhancement of electrons in the gate electrodes 125.

Referring to FIG. 4, a resistance of each of the gate electrodes including graphene when the insulation pattern between the gate electrodes includes h-BN may be much smaller than a resistance of each of the gate electrodes including graphene when the insulation pattern between the gate electrodes includes h-BN includes silicon oxide, which means that the mobility of electrons in each gate electrode may be remarkably enhanced.

In an implementation, the first insulation pattern 115 may have a small thickness, e.g., in a range of about 0.3 nm to about 10 nm, which may be distinguished from an insulation pattern including silicon oxide and having a much larger thickness, in order to prevent the leakage current. Not only the gate electrodes 125 but also the first insulation patterns 115 may have the small thickness, and the formation of the hole 140 for forming the pillar structure 170 may be facilitated.

The vertical electrode 160 may have a width, e.g., in a range of about 0.3 nm to about 10 nm, and the pillar structure 170 including the vertical electrode 160 may have a small width. As a result, the vertical variable resistance memory device including a plurality of pillar structures 170 may have an enhanced integration degree.

Figure 9:
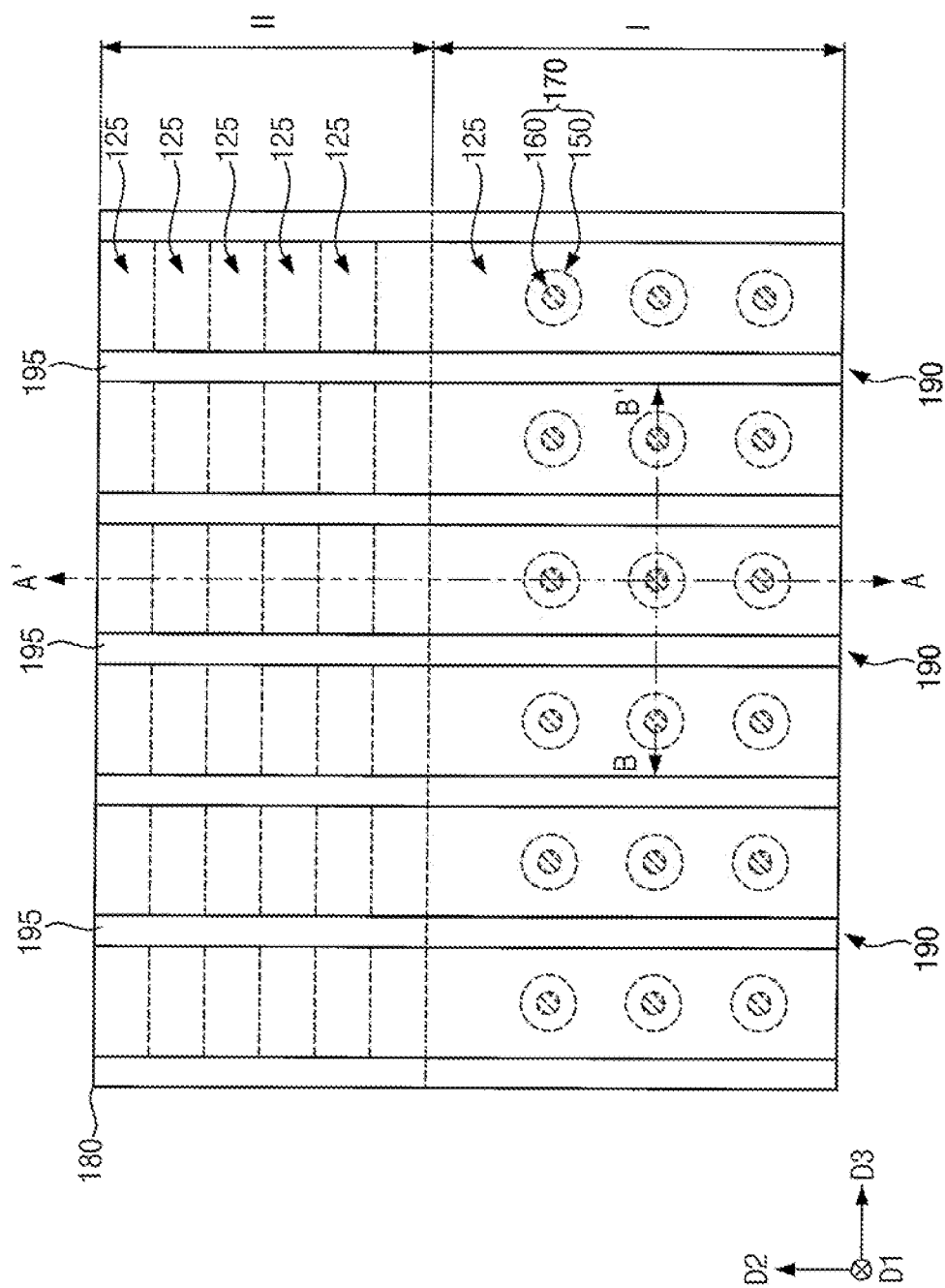
Figure 10:
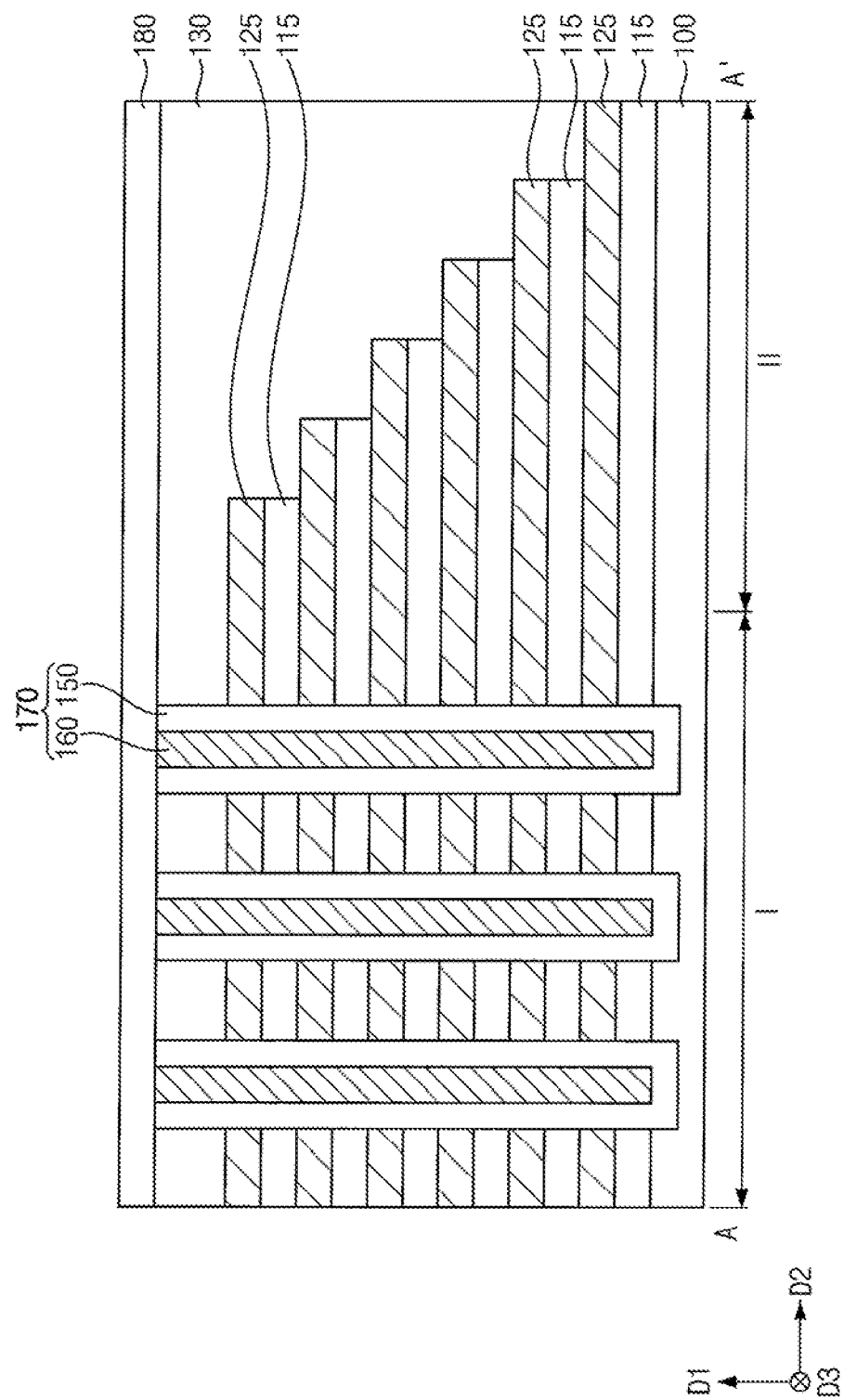
Figure 11:
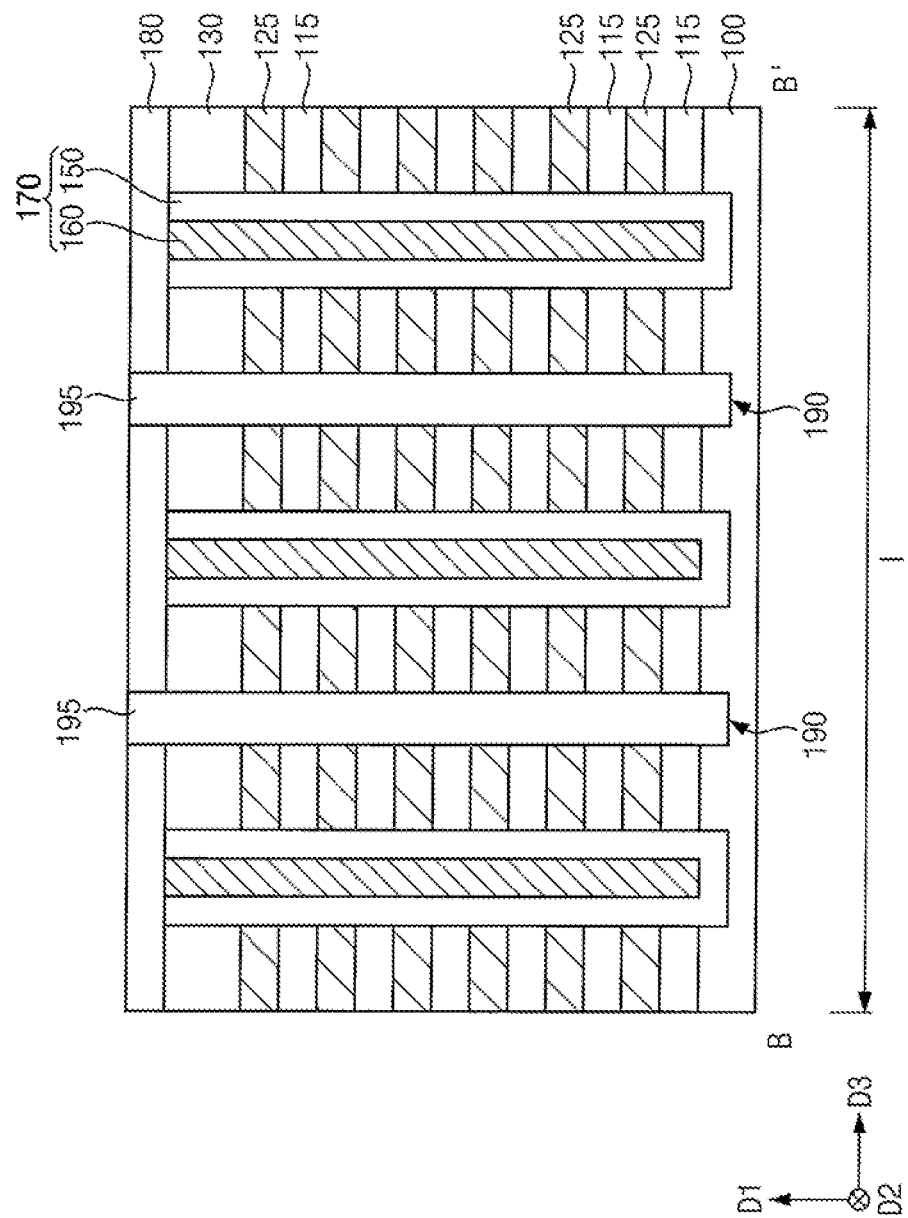
Figure 12:
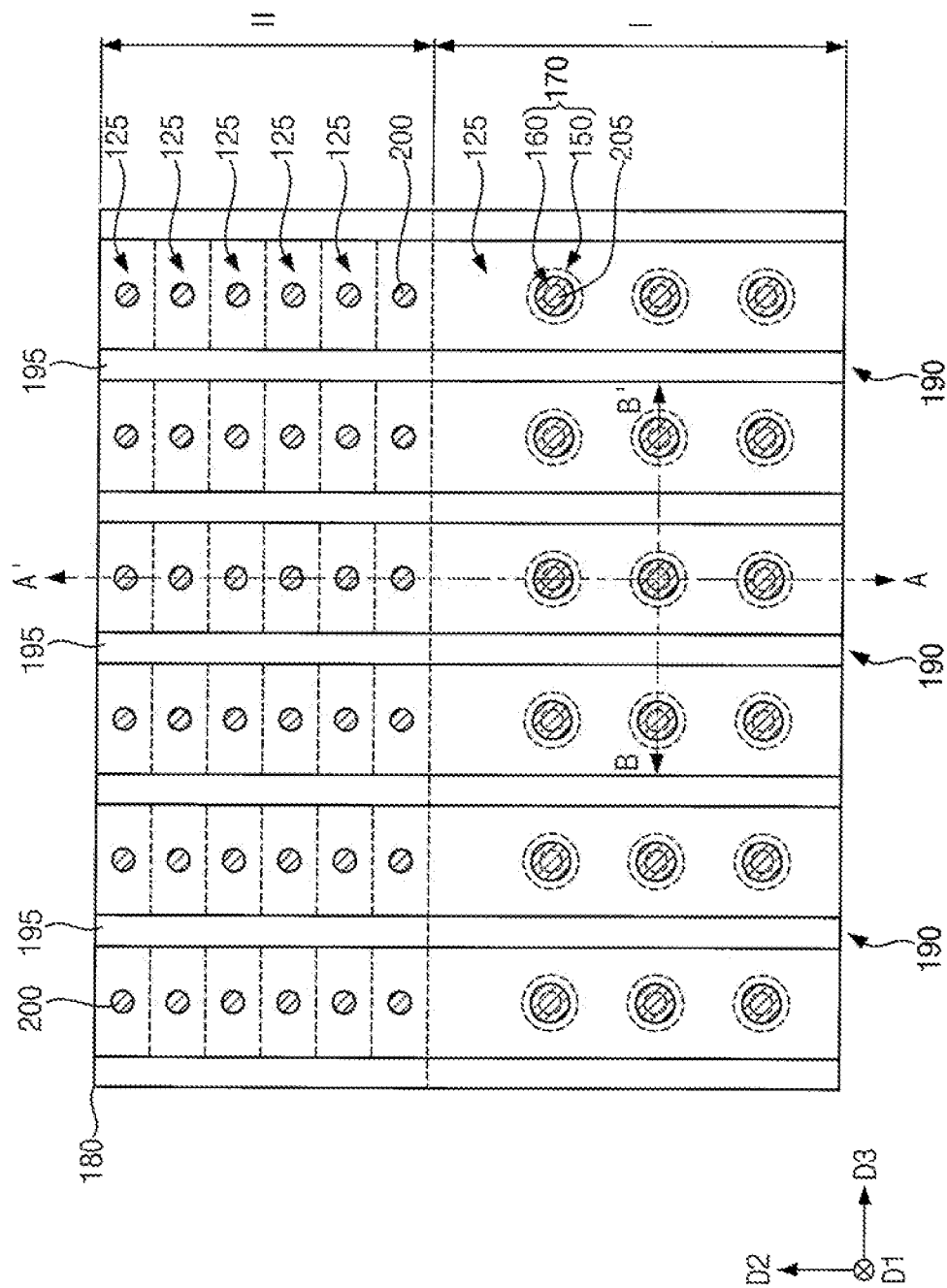
Figure 13:
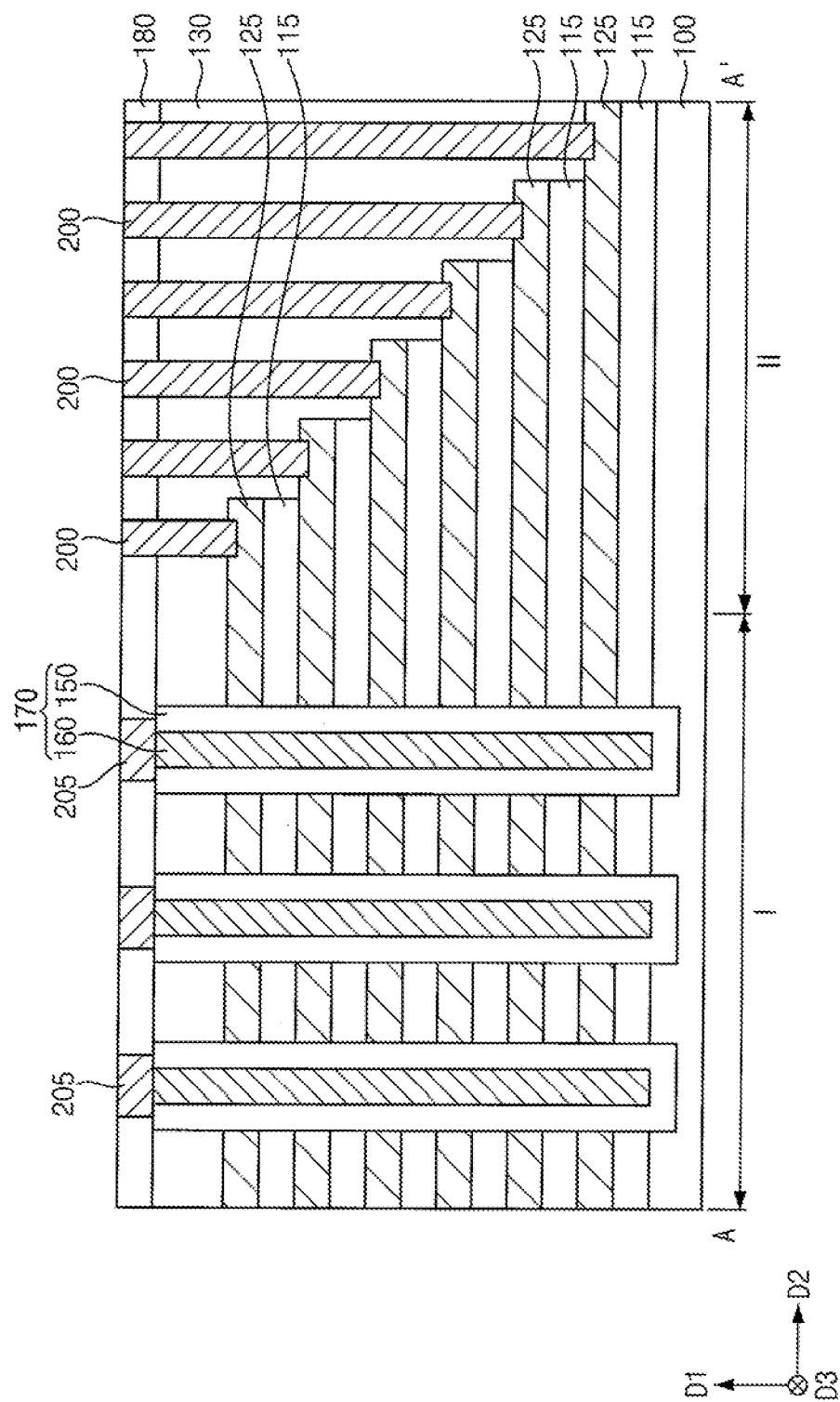
Figure 14:
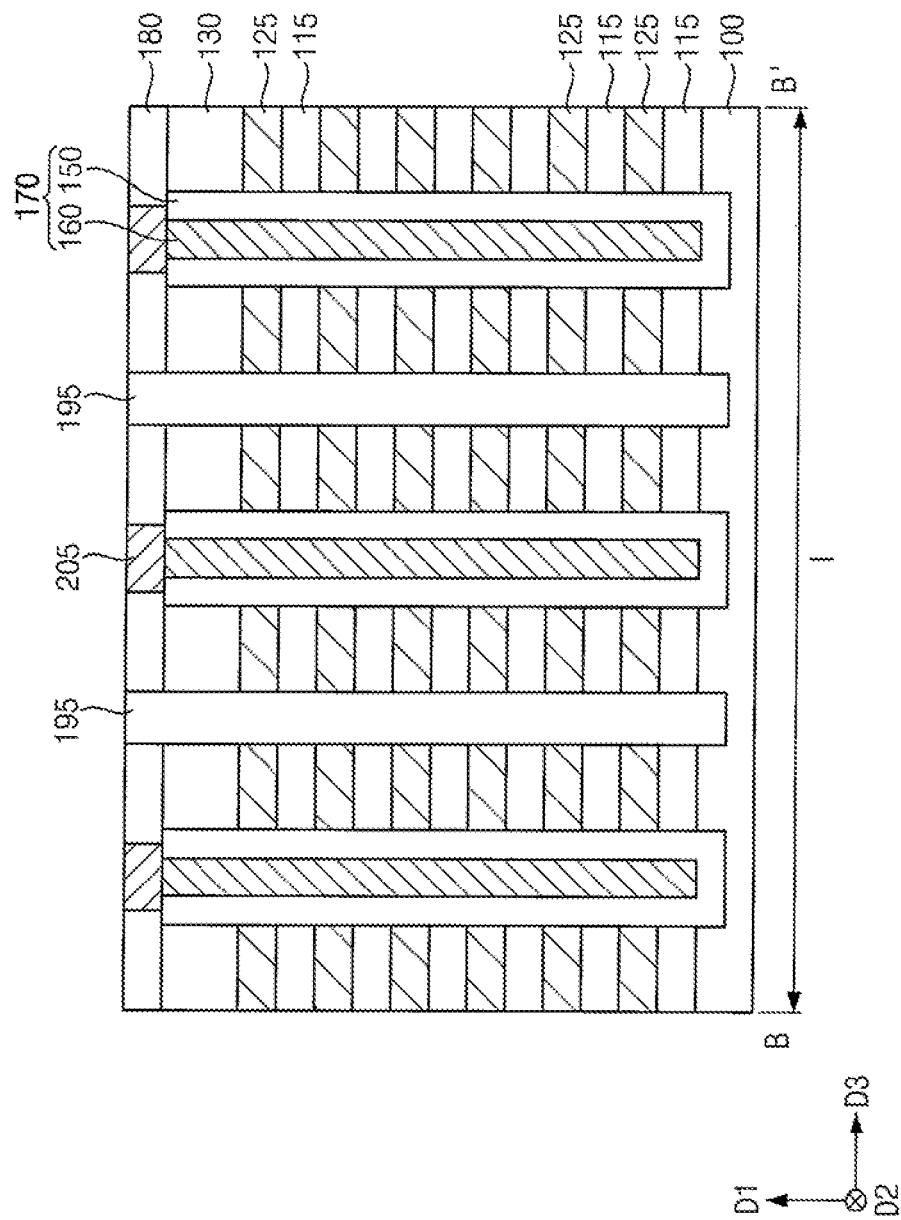

FIGS. 5 to 14 are plan views and cross-sectional views of stages in a method of manufacturing a vertical variable resistance memory device in accordance with example embodiments. FIGS. 5, 7, 9 and 12 are the plan views, and FIGS. 6, 8, 10 and 13 are cross-sectional views taken along lines A-A' of corresponding plan views, respectively, and FIGS. 11 and 14 are cross-sectional views taken along lines B-B' of corresponding plan views, respectively.

Figure 5:
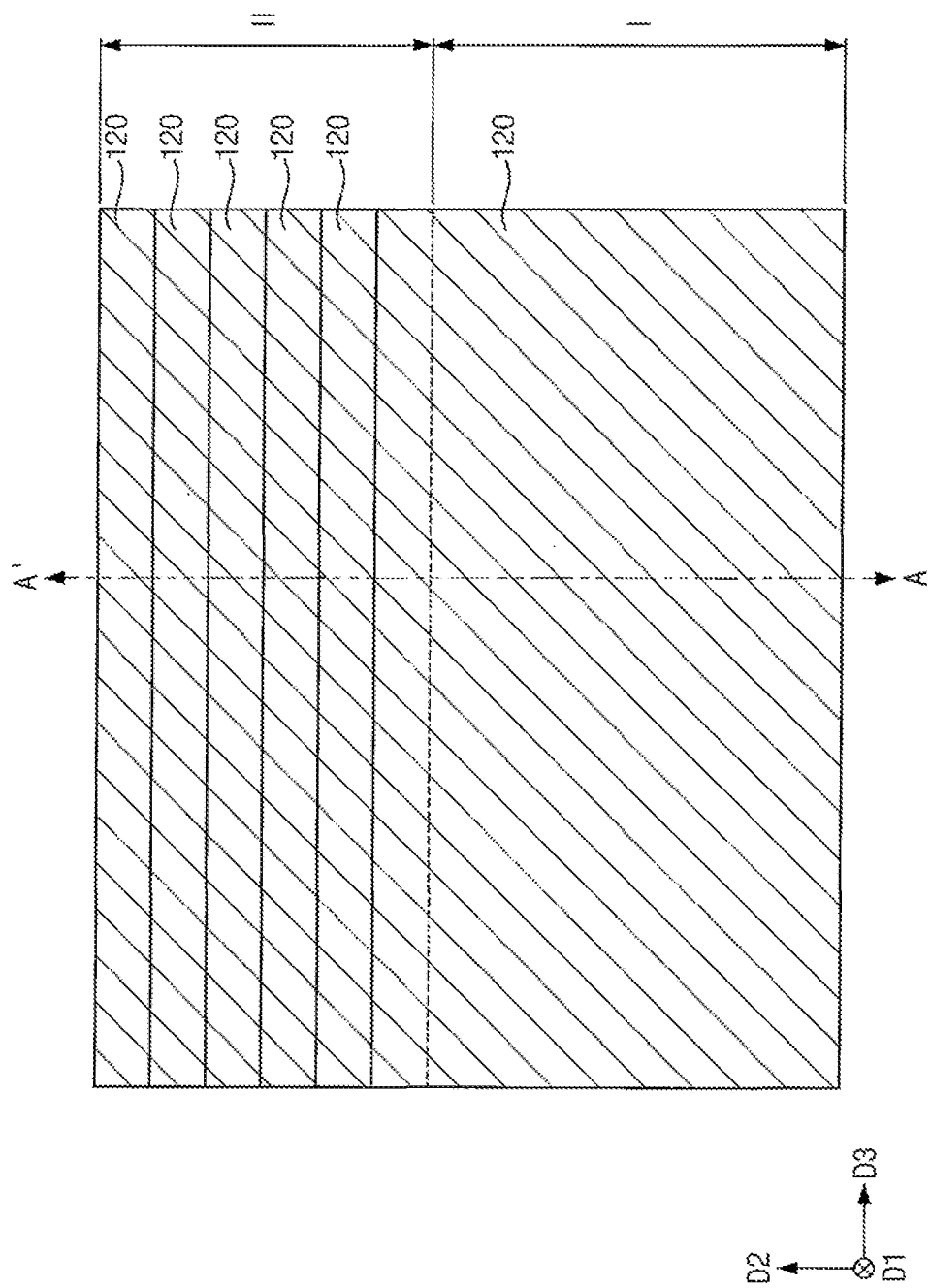
FIGS. 5 to 14 are plan views and cross-sectional views of stages in a method of manufacturing a vertical variable resistance memory device in accordance with example embodiments.
Figure 6:
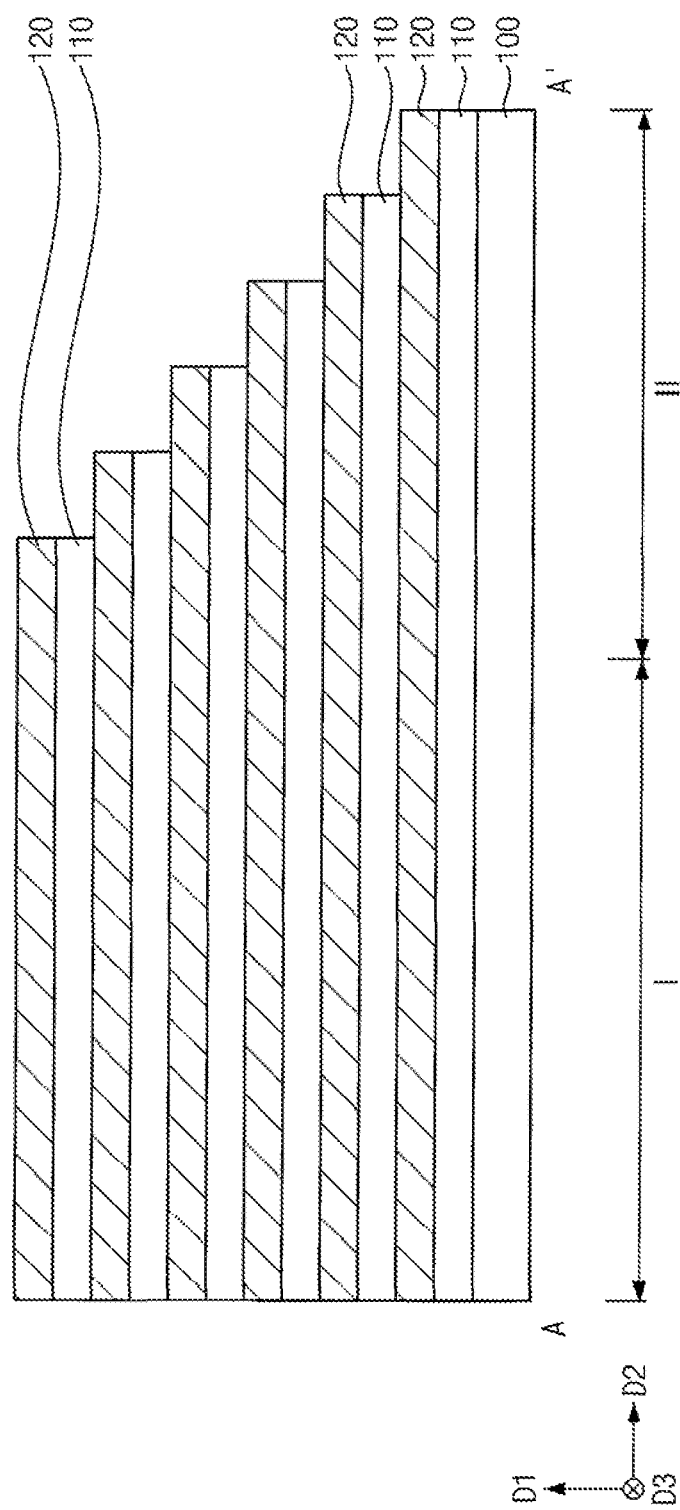

Referring to FIGS. 5 and 6, a first insulation layer 110 and a gate electrode layer 120 may be alternately and repeatedly stacked on a substrate 100 including first and second regions I and II to form a mold layer.

A photoresist pattern partially covering an uppermost one of the gate electrode layers 120 may be formed on the uppermost one of the gate electrode layers 120, and the uppermost one of the gate electrode layers 120 and an uppermost one of the first insulation layers 110 may be etched using the photoresist pattern as an etching mask. Thus, one of the gate electrode layers 120 under the uppermost one of the first insulation layers 110 may be partially exposed. A trimming process for reducing an area of the photoresist pattern may be performed, and the uppermost one of the gate electrode layers 120, the uppermost one of the first insulation layers 110, the exposed one of the gate electrode layers 120, and one of the first insulation layers 110 thereunder may be etched again using the reduced photoresist pattern as an etching mask.

The etching process and the trimming process may be alternately and repeatedly performed to form a mold having a plurality of step layers each including the first insulation layer 110 and the gate electrode layer 120 sequentially stacked on the substrate 100. A portion of each of the step layers not overlapped with upper step layers in the first direction D1, e.g., each of opposite end portions in the second direction D2 of each of the step layers may be referred to as a "step." In an implementation, a plurality of steps may be formed on the second region II of the substrate 100.

Figure 7:
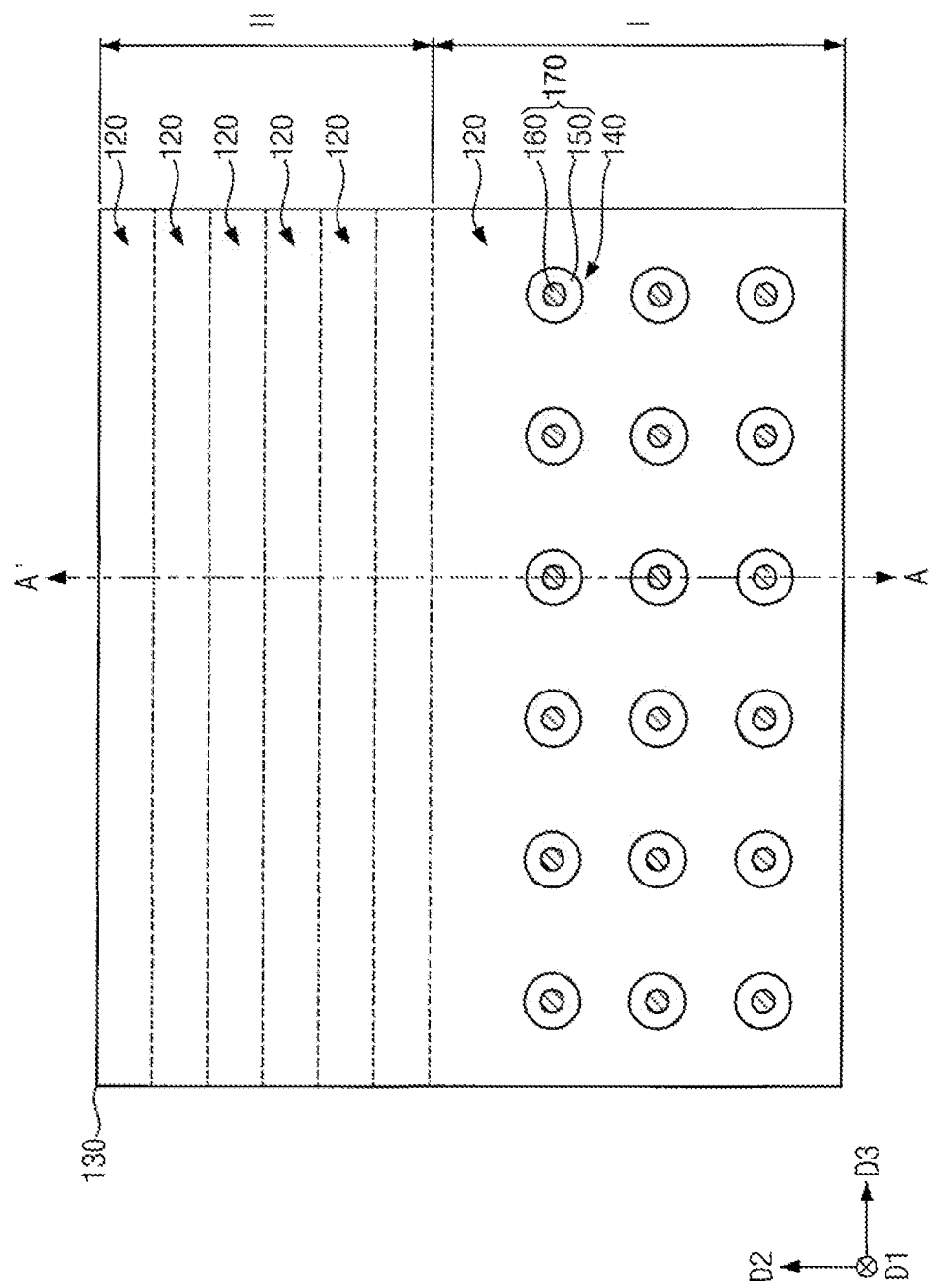
Figure 8:
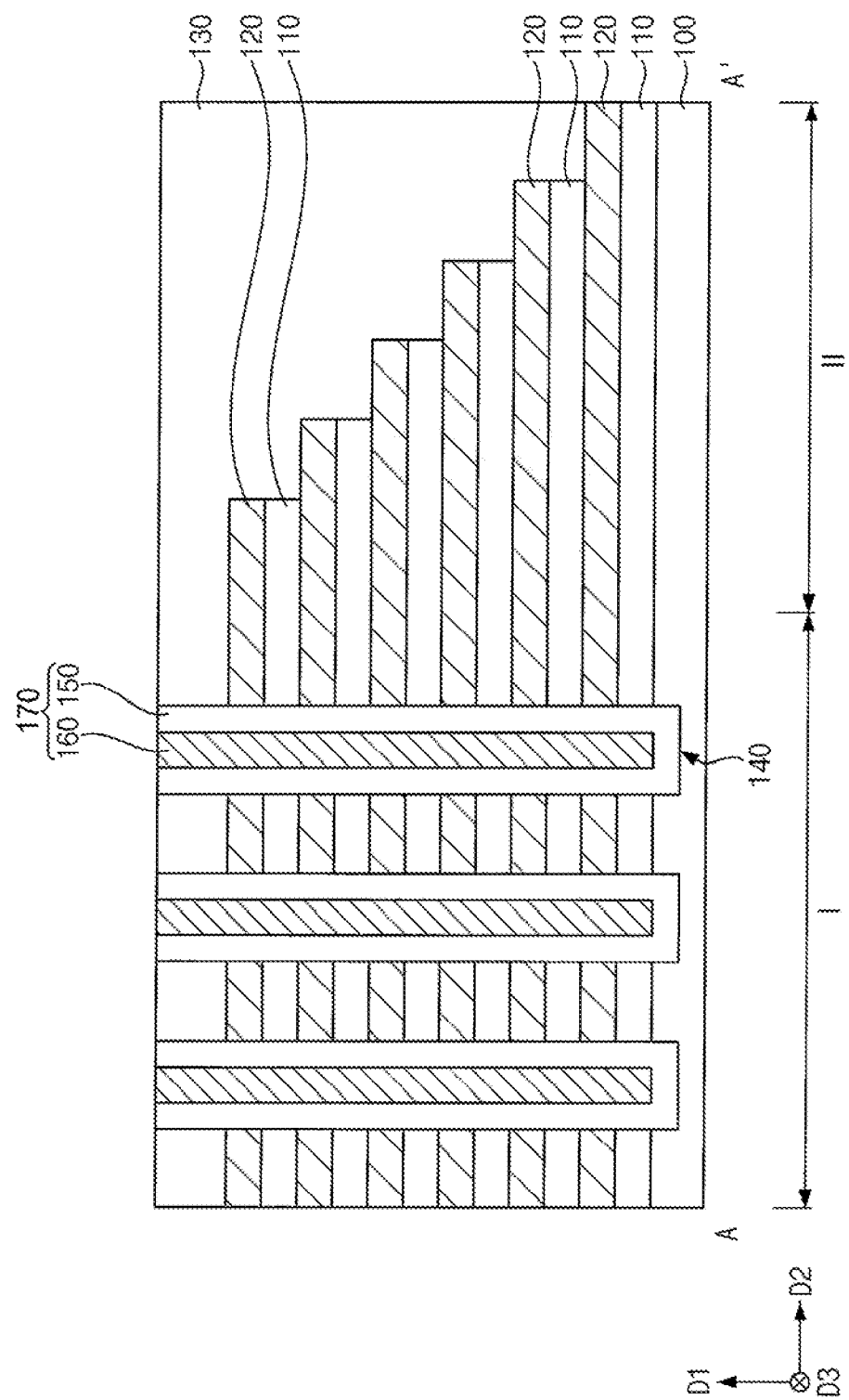

Referring to FIGS. 7 and 8, a first insulating interlayer 130 may be formed on the substrate 100 to cover the mold, and the first insulating interlayer 130 and the mold may be etched to form a hole 140 exposing an upper surface of the substrate 100.

In example embodiments, a plurality of holes 140 may be formed in each of the second and third directions D2 and D3 on the first region I of the substrate 100.

A variable resistance layer may be formed on a sidewall of the hole 140, the exposed upper surface of the substrate 100, and an upper surface of the first insulating interlayer 130, and a vertical electrode layer may be formed on the variable resistance layer to fill the hole 140.

The vertical electrode layer and the variable resistance layer may be planarized until an upper surface of the first insulating interlayer 130 is exposed, and may form a vertical electrode 160 and a variable resistance pattern 150, respectively. The vertical electrode 160 extending in the first direction D1 and the variable resistance pattern 150 covering a sidewall and a lower surface of the vertical electrode 160 may form a pillar structure 170. In an implementation, a plurality of pillar structures 170 may be formed to be spaced apart in each of the second and third directions D2 and D3 on the first region I of the substrate 100.

In an implementation, the planarization process may include a chemical mechanical polishing (CMP) process and/or an etch back process.

Referring to FIGS. 9 to 11, a second insulating interlayer 180 may be formed on the first insulating interlayer 130 and the pillar structure 170, and an opening 190 may be formed through the first and second insulating interlayers 130 and 180 and the mold to expose an upper surface of the substrate 100 by an etching process.

In an implementation, the opening 190 may extend in the second direction D2 on the first and second regions I and II of the substrate 100, and a plurality of openings 190 may be formed to be spaced apart in the third direction D3. In an implementation, the opening 190 may extend to each of opposite ends in the second direction D2 of the mold, and the mold may be divided into a plurality of pieces in the third direction D3. The mold may have a staircase shape having an extension length in the second direction D2 decreasing in a stepwise manner from a lowermost level toward an uppermost level, and an extension length in the second direction D2 of the opening 190 may be equal to or greater than an extension length in the second direction D2 of a lowermost one of the step layers in the mold.

As the opening 190 is formed, the first insulation layer 110 may be divided into first insulation patterns 115 each of which may extend in the second direction D2, and the gate electrode layer 120 may be divided into a plurality of gate electrodes 125 each of which may extend in the second direction D2.

A second insulation layer may be formed on the exposed upper surface of the substrate 100 and an upper surface of the second insulating interlayer 180 to fill the opening 190, and may be planarized until the upper surface of the second insulating interlayer 180 is exposed to form a second insulation pattern 195 in the opening 190.

In an implementation, the second insulation pattern 195 may include a material substantially the same as that of the first insulation pattern 115. In an implementation, the second insulation pattern 195 may be merged with the first insulation pattern 115.

Referring to FIGS. 12 to 14, a first contact plug 200 (extending through the first and second insulating interlayers 130 and 180 to contact the gate electrode 125), and a second contact plug 205 (extending through the second insulating interlayer 180 to contact the vertical electrode 160) may be formed.

In an implementation, the first contact plug 200 may contact a pad of each of the gate electrodes 125 on the second region II of the substrate 100, and thus a plurality of first contact plug 200 may be formed to be spaced apart from each other in each of the second and third directions D2 and D3 on the second region II of the substrate 100.

In an implementation, the second contact plug 205 may contact the vertical electrode 160 of the pillar structure 170 on the first region I of the substrate 100, and according to the arrangement of the pillar structure 170, a plurality of second contact plugs 205 may be spaced apart from each other in each of the second and third directions D2 and D3 on the first region I of the substrate 100.

Referring to FIGS. 1 to 3 again, a third insulating interlayer 210 may be formed on the second insulating interlayer 180, and first and second wirings 220 and 225 extending through the third insulating interlayer 210 to contact upper surfaces of the first and second contact plugs 200 and 205, respectively, may be formed. Thus, the fabrication of the vertical variable resistance memory device may be completed.

In an implementation, the first wiring 220 may extend in the second direction D2 on the second region II of the substrate 100, and a plurality of first wirings 220 may be spaced apart from each other in the third direction D3.

In an implementation, the second wiring 225 may extend in the third direction D3 on the first region I of the substrate 100, and a plurality of second wirings 225 may be spaced apart from each other in the second direction D2.

By way of summation and review, the mobility of electrons in gate electrodes deteriorated due to the surface roughness of insulation patterns between the gate electrodes. Additionally, insulation patterns may have a large thickness in order to prevent the leakage current, and the formation of holes for forming vertical electrodes penetrating through the gate electrodes and the insulation patterns may be difficult.

One or more embodiments may provide a vertical variable resistance memory device having improved characteristics.

In the vertical variable resistance memory device in accordance with example embodiments, the gate electrodes and the insulation patterns therebetween may include graphene and h-BN, respectively, and may have a relatively small thickness. Thus, process difficulty of formation of the vertical electrode extending through the gate electrodes and the insulation patterns may be reduced. Additionally, the gate electrode between the insulation patterns including h-BN may have a reduced resistance, and thus the mobility of electrons therein may be enhanced. Furthermore, the vertical electrode may include graphene, and it may have a small width, and thus the vertical variable resistance memory device may have an enhanced integration degree.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical variable resistance memory device, comprising:
    gate electrodes spaced apart from each other in a first direction on a substrate to form a plurality of gate electrode structures, each of the gate electrodes including graphene and extending in a second direction, the first direction being substantially perpendicular to an upper surface of the substrate and the second direction being substantially parallel to the upper surface of the substrate;
    first insulation patterns between the gate electrodes, each of the first insulation patterns including boron nitride (BN);
    second insulation patterns between the gate electrodes and extending along the first direction into the substrate, and each of the second insulation patterns including amorphous boron nitride and being in direct contact with the substrate; and
    pillar structures extending in the first direction through the gate electrodes and the first insulation patterns on the substrate, each of the pillar structures includes a vertical gate electrode extending in the first direction and a variable resistance pattern on a sidewall of the vertical gate electrode;
    first wirings electrically connected to the plurality of gate electrode structures, each of the first wirings extending in the second direction on the plurality of gate electrode structures; and
    second wirings electrically connected to the vertical gate electrodes of the pillar structures, each of the second wirings extending in a third direction on the pillar structures to overlap the second insulation patterns, the third direction being substantially parallel to the upper surface of the substrate and crossing the second direction,
    wherein the first insulation patterns include amorphous boron nitride (a-BN); and
    wherein each of the second insulation patterns has an extension extending continuously in the second direction between the pillar structures that are spaced apart from each other along a third direction crossing to the second direction.

2. The vertical variable resistance memory device as claimed in claim 1, wherein the pillar structures are spaced apart from each other in the second direction.

3. The vertical variable resistance memory device as claimed in claim 2, wherein
    the plurality of gate electrode structures are spaced apart from each other in the third direction that is substantially parallel to the upper surface of the substrate and substantially perpendicular to the second direction.

4. The vertical variable resistance memory device as claimed in claim 3, wherein:
    the gate electrodes in each of the plurality of gate electrode structures are stacked in a staircase shape in which extension lengths of the gate electrodes in the second direction decrease in a stepwise manner from a lowermost level toward an uppermost level, and
    the extension of the second insulation patterns has a length in the second direction greater than or equal to an extension length in the second direction of a lowermost one of the gate electrodes in each of the plurality of gate electrode structures.

5. The vertical variable resistance memory device as claimed in claim 4, wherein the first insulation patterns between the gate electrodes in each of the plurality of gate electrode structures are stacked in a staircase shape in which extension lengths of the first insulation patterns in the second direction decrease in a stepwise manner from a lowermost level toward an uppermost level.

6. The vertical variable resistance memory device as claimed in claim 3, wherein an upper surface of the second insulation patterns is higher than upper surfaces of the gate electrode structures.

7. The vertical variable resistance memory device as claimed in claim 1, wherein the variable resistance pattern includes a perovskite-based material or a transition metal oxide.

8. A vertical variable resistance memory device, comprising:
    gate electrode structures each including gate electrodes spaced apart from each other in a first direction on a substrate, each of the gate electrodes extending in a second direction, the gate electrode structures being spaced apart from each other in a third direction, the first direction being substantially perpendicular to an upper surface of the substrate, the second direction being substantially parallel to the upper surface of the substrate, the third direction being substantially parallel to the upper surface of the substrate and crossing the second direction, and the gate electrodes in each of the gate electrode structures being stacked in a staircase shape in which extension lengths of the gate electrodes in the second direction decrease in a stepwise manner from a lowermost level toward an uppermost level;
    first insulation patterns between the gate electrodes in each of the gate electrode structures, each of the first insulation patterns including amorphous boron nitride (a-BN);
    second insulation patterns between the gate electrode structures and extending into the substrate, each of the second insulation patterns including a-BN and being in direct contact with the substrate, the second insulation patterns electrically insulating the gate electrode structures from each other; and
    pillar structures extending in the first direction on the substrate, the pillar structures extending through the gate electrodes and the first insulation patterns therebetween in each of the gate electrode structures, and each of the pillar structures includes a concentric arrangement comprising a vertical gate electrode extending in the first direction and a variable resistance pattern on a sidewall of the vertical gate electrode;

first wirings electrically connected to the gate electrode structures, each of the first wirings extending in the second direction on the gate electrode structures; and second wirings electrically connected to the vertical gate electrodes of the pillar structures, each of the second wirings extending in the third direction on the pillar structures to overlap the second insulation patterns, wherein the second insulation patterns have an extension extending continuously in the second direction between the pillar structures that are spaced apart from each other along the third direction, and wherein the extension of the second insulation patterns is greater than or equal to an extension length of a lowermost one of the gate electrodes in each of the gate electrode structures.

9. The vertical variable resistance memory device as claimed in claim 8, wherein upper surfaces of the second insulation patterns are higher than upper surfaces of the gate electrode structures.

10. The vertical variable resistance memory device as claimed in claim 8, wherein lower surfaces and sidewalls of ones of the gate electrodes in each of the gate electrode structures are covered by the first insulation patterns and the second insulation patterns.

11. The vertical variable resistance memory device as claimed in claim 8, wherein:

each of the first insulation patterns between the gate electrodes and one of the gate electrodes directly contacting an upper surface thereof in each of the gate electrode structures form a step layer, and a plurality of step layers are stacked in a staircase shape in which extension lengths in the second direction of the step layers decrease in a stepwise manner from a lowermost level toward an uppermost level.

12. The vertical variable resistance memory device as claimed in claim 8, wherein each of the gate electrodes and the vertical gate electrode include graphene.

13. The vertical variable resistance memory device as claimed in claim 8, wherein the pillar structures are spaced apart from each other in the second direction.

14. A vertical variable resistance memory device, comprising:

gate electrode structures each including gate electrodes spaced apart from each other in a first direction on a substrate, each of the gate electrodes including graphene and extending in a second direction, the gate electrode structures being spaced apart from each other in a third direction, the first direction being substantially perpendicular to an upper surface of the substrate, the second direction being substantially parallel to the upper surface of the substrate, and the third direction being substantially parallel to the upper surface of the substrate and crossing the second direction;

first insulation patterns between the gate electrodes in each of the gate electrode structures, each of the first insulation patterns including amorphous boron nitride (a-BN);

second insulation patterns between the gate electrode structures and extending into the substrate, each of the second insulation patterns including a-BN and being in direct contact with the substrate, the second insulation patterns electrically insulating the gate electrode structures from each other;

pillar structures each extending in the first direction on the substrate, each of the pillar structures extending through the gate electrodes and the first insulation patterns therebetween in each of the gate electrode structures, and each of the pillar structures including:

a vertical gate electrode including graphene and extending in the first direction; and a variable resistance pattern on a sidewall of the vertical gate electrode, first wirings electrically connected to the gate electrode structures, each of the first wirings extending in the second direction on the gate electrode structures; and second wirings electrically connected to the vertical gate electrodes of the pillar structures, each of the second wirings extending in the third direction on the pillar structures to overlap the second insulation patterns, wherein each of the second insulation patterns has an extension extending continuously in the second direction between the pillar structures that are spaced apart from each other along the third direction.

15. The vertical variable resistance memory device as claimed in claim 14, wherein upper surfaces of the second insulation patterns are higher than upper surfaces of the gate electrode structures.

16. The vertical variable resistance memory device as claimed in claim 14, wherein:

the extension of the second insulation patterns has a length in the second direction greater than or equal to an extension length in the second direction of a lowermost one of the gate electrodes in each of the gate electrode structures.

* * * * *